United States Patent [19]

Bersin

[11] Patent Number: 4,699,689

[45] Date of Patent: Oct. 13, 1987

[54] METHOD AND APPARATUS FOR DRY PROCESSING OF SUBSTRATES

[75] Inventor: Richard L. Bersin, Orange, Conn.

[73] Assignee: Emergent Technologies Corporation, New Haven, Conn.

[21] Appl. No.: 824,438

[22] Filed: Jan. 31, 1986

Related U.S. Application Data

[63] Continuation-in-part of Ser. No. 735,446, May 17, 1985.

[51] Int. Cl.[4] .................. B44C 1/22; C03C 15/00; C03C 25/06; B29C 17/08
[52] U.S. Cl. ............................ 156/643; 156/646; 156/655; 156/668; 156/345; 204/298; 204/192.32; 252/79.1
[58] Field of Search .......... 156/643, 646, 655, 668, 156/345; 204/192 E, 298; 427/38, 39, 41, 53.1, 54.1, 55; 430/329; 252/79.1; 219/121 LJ, 121LH, 121 LM

[56] References Cited

U.S. PATENT DOCUMENTS

| | | | |
|---|---|---|---|
| 3,664,899 | 5/1972 | Wright et al. | 156/657 |
| 4,260,649 | 4/1981 | Dension et al. | 156/635 X |
| 4,341,592 | 7/1982 | Shortes et al. | 156/643 |
| 4,417,948 | 11/1983 | Mayne-Banton | 219/121 LM |

Primary Examiner—William A. Powell
Attorney, Agent, or Firm—St. Onge Steward Johnston & Reens

[57] ABSTRACT

A method is provided for removing photoresist from a substrate, wherein the method comprises producing a gas plasma from a gas mixture comprising oxygen, $CF_4$, nitrogen, and hydrogen; substantially eliminating any electrically charged particles from the plasma to produce a plasma effluent; heating the substrate to a temperature in the range of from about 250 to 300 degrees Centigrade; exposing the substrate and photoresist thereon to the effluent while said temperature is maintained; and simultaneously with the exposure step, irradiating the substrate with collimated ultraviolet radiation.

4 Claims, 6 Drawing Figures

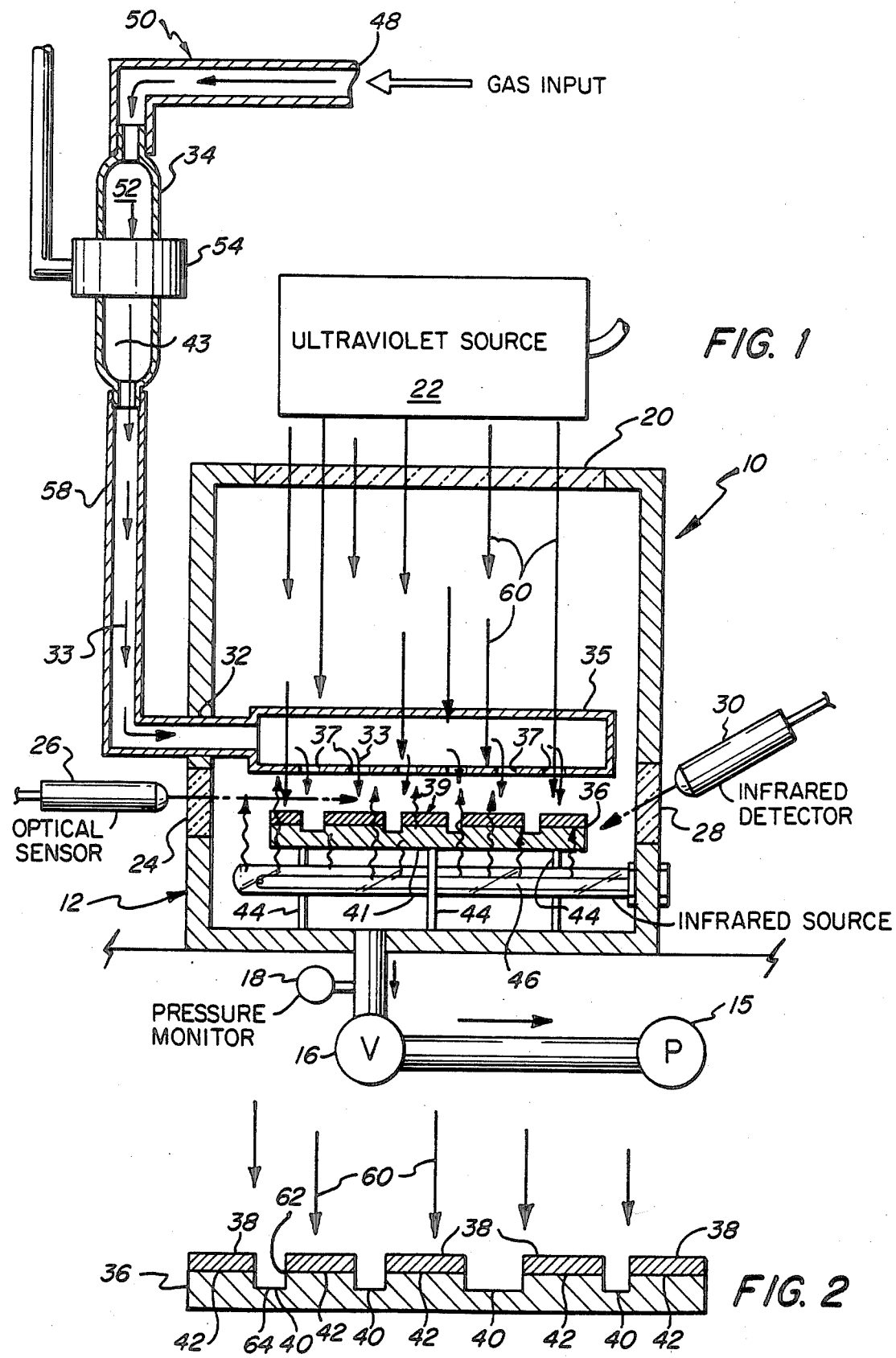

METHOD AND APPARATUS FOR DRY PROCESSING OF SUBSTRATES

This application is a continuation-in-part of Application Ser. No. 735,446 filed May 17, 1985 entitled Method and Apparatus for Dry Processing of Substrates and filed by Richard L. Bersin.

BACKGROUND OF THE INVENTION

(1) Field of the Invention

This invention relates to a method and apparatus for dry process fabrication of devices from a substrate. In particular, a method for etching a substrate and stripping photoresist from a substrate during device fabrication is provided. More specifically, a substrate is exposed to the effluent of a gas plasma having at least one reactive specie, but being substantially free of electrically charged particles, the substrate being simultaneously irradiated with ultraviolet radiation to enhance the reaction rate in a controlled manner. The substrate may also be heated by infrared radiation. The composition of the gas plasma and the temperature of the substrate may be adjusted to appropriately control the rates of the desired reactions.

(2) Description of the Prior Art

The use of a gas plasma in the fabrication of solid state devices is known in the prior art. Plasmas have been used both in the etching of semiconductor substrates and in the stripping or removal of photoresist layers from substrates.

Plasma processing, also known as dry processing or RIE (reactive ion etching), has several distinct advantages over the more conventional processing, known as chemical or wet processing. Wet processes typically use toxic compositions to remove photoresists or to etch a layer or layers of material from a substrate. Some chemical compositions may be hazardous to the individual operator and to the environment if not carefully used. Waste disposal from wet etching processes can also present a problem.

Wet etching is isotropic in that etching proceeds at a substantially equal rate in all directions, thereby leading to an etch that extends not only downwardly in the desired direction but laterally as well. Isotropy produces an undesirable undercutting effect, reducing the distances between adjacent etches to often unacceptably small distances. If line widths, or the lateral distances between adjacent etches, must be held within very small tolerances such as those required for the small geometries of many LSI or VLSI devices, wet etching may not be usable. In many of these devices, the line tolerances are often comparable to the thicknesses of the films being etched, and anisotropy is therefore essential.

The isotropic etching that results from wet processes has become more unacceptable to the industry as the density of circuit elements placed on a single semicondutor substrate has increased. As element density increases, the line widths decrease, and isotropic etching becomes more unacceptable. Accordingly, the need for anisotropic or straight-walled etching has increased.

As compared to wet etching, dry etching provides the capability of anisotropic etching for holding line widths within specified tolerances. In the typical dry etching apparatus, the semiconductor wafers or substrates being processed are placed in a plasma etching chamber directly within the plasma or glow discharge region, where electrically charged particles and relatively strong electric fields are present. The presence of charged particles within the region of a strong electric field achieves anisotropy in the etching process, because the electric field imparts directionality to the charged etching species. Precise device fabrication is thereby possible.

However, the semiconductor layers on LSI or VLSI devices, such as for example a dielectric layer of silicon dioxide, can be relatively thin, perhaps on the order of 1 micron, and ion bombardment from the charged particles being accelerated into the layer by the electric field can result in electrical anomalies or unacceptable damage to the layer, known generally as radiation damage. As oxide layers decrease in thickness, the number of defective chips and reduction of chip yields per wafer caused by radiation damage increases to unacceptable proportions.

Radiation damage is likewise a problem in dry photoresist strippers, and is not a problem limited only to plasma etching. Also, static charge builds up on the surface of exposed dielectric layers. For example, EPROM devices normally incorporate a dielectric oxide layer only 100 angstroms thick. Static charging of the dielectric layer during dry stripping of photoresist can result in dielectric breakdown and resultant inoperability of the device.

Dry etching devices wherein the substrate being etched is removed from the plasma itself, i.e. a "downstream" etching apparatus, is known in the art. However, while the problem of radiation damage is reduced, the typical downstream device suffers from the same inadequacy of the wet etching devices in that etching is unacceptably isotropic, because in the downstream device there is typically no electric field to impart any directionality to the etching species.

U.S. Pat. No. 4,233,109 to Nishizawa discloses a plasma etching method using a plasma generator to ionize a reaction gas into a plasma state. The generator is connected to a processing chamber by a nozzle for introducing the plasma into the chamber, which contains a workpiece to be processed.

It is also known to use photons to affect the action of a plasma reactor. U.S. Pat. No. 4,183,780 to McKenna et al. describes a method and apparatus for photon enhanced reactive ion etching, wherein the plasma reactor includes means for emitting selected wavelengths of vacuum ultraviolet and directing this radiation to the plasma, preferably adjacent the substrate to control the plasma process, especially at the substrate. U.S. Pat. Nos. 4,404,072 to Kohl and 4,478,677 to Chen et al. disclose the use of light in etching methods.

However, none of these references either singly or in combination show a downstream plasma reactor or method that combines reduction or avoidance of radiation damage with the capability of directionality for the active species, which is desirable in the fabrication of LSI or VLSI devices.

SUMMARY OF THE INVENTION

In accordance with the present invention, a method for removing or stripping photoresist from a substrate and also etching a substrate is provided.

In one preferred embodiment for removing photoresist, a gas plasma is produced from a gas mixture comprising oxygen, $CF_4$, nitrogen, and hydrogen. Any electrically charged particles are substantially eliminated from this plasma to form a plasma effluent. The substrate from which photoresist is to be removed is heated, preferably by infrared radiation, to a temperature in the range of about 250 degrees to 300 degrees Centigrade. The substrate and the photoresist thereon is then exposed to the plasma effluent while the substrate temperature is maintained, and the substrate is simultaneously irradiated with collimated ultraviolet radiation.

In another preferred embodiment, also for removing photoresist, the gas plasma is produced from a gas mixture comprising oxygen, nitrogen, and hydrogen and the substrate is heated to a temperature of greater than about 275 degrees Centigrade.

In yet another preferred embodiment, this embodiment for etching the substrate, the gas mixture comprises $CF_4$ and oxygen and the substrate is heated to a temperature of approximately 200 degrees Centigrade.

The present invention makes it possible to independently control the type of reactive chemical species in the plasma effluent, the UV excitation, and temperature to optimize the photoresist stripping or the etching process. In the typical prior art plasma system, these three parameters are inextricably interwoven such that independent control and therefore optimization is impossible.

Because the process of the present invention is essentially a chemical process carried out where there are substantially no ions and particle energies are relatively low, chemical selectivities to achieve high etch rates for materials over substrates which etch very slowly to minimize substrate damage can be much better controlled than within the typical prior art plasma system. Also, unique chemical selectivities which may also be temperature dependent provide means for additional control of the processes.

It is an object of this invention to provide a dry etching method and apparatus wherein the deleterious effects of radiation damage are minimized.

It is a further object of this invention to provide a dry etching method and apparatus wherein anisotropic etching can be achieved using a downstream system.

It is a further object of this invention to provide a method and apparatus for efficient dry stripping of photoresist from semiconductor wafers with a minimum of destructive etching and radiation damage.

It is a further object of this invention to provide a method for removing photoresist at a relatively high rate with negligible etching of exposed substrate material.

It is a further object of this invention to provide a method for maximizing the rate of etching the exposed substrate, while maximizing the rate of removal of the photoresist.

Further attendant advantages of the apparatus and method of the present invention will be apparent from the following brief description of the drawings and detailed description of the preferred embodiment.

BRIEF DESCRIPTION OF THE DRAWINGS

FIG. 1 is a sectional side view depicting an apparatus for practicing the method of the present invention;

FIG. 2 is a side view depicting a cross-section of substrate as it is produced by the method and apparatus of the present invention;

DETAILED DESCRIPTION OF THE PREFERRED EMBODIMENT

Figure 3:
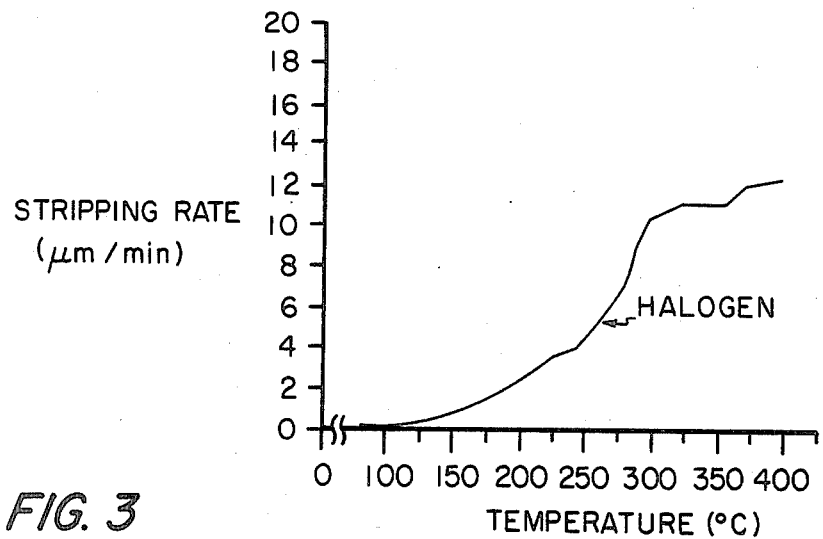
FIG. 3 is a plot of stripping rate versus temperature for a preferred embodiment of the present invention.

FIG. 1 depicts an apparatus 10 for processing a substrate. This process can be etching of a semiconductor or other substrate, such as silicon or polysilicon; stripping or removal of organic photoresist layers from a substrate; or other similar treatment of the surface of a substrate.

Apparatus 10 comprises a reaction chamber 12 for containing at least one substrate 36 to be processed. Chamber 12 can be any suitable means for containing the substrate and is typically a sealed chamber capable of maintaining a vacuum down to approximately 0.01 mm Hg. Pump P denoted as 15 in FIG. 1, in conjunction with valve V denoted as 16, controls evacuation of chamber 12 and maintains a vacuum. The system exhaust is controlled independently of the gas inputs, described more fully below, thereby allowing control of mass flow independent of pressure and gas resident time in the chamber. Pressure monitor 18 gives an indication of the pressure or vacuum maintained inside chamber 12.

Chamber 12 has a thick, vacuum-rated, clear fused quartz window 20 positioned in a first side of the chamber 12, shown as the upper side in FIG. 1. As will be described in more detail below, ultraviolet (UV) radiation from an ultraviolet source 22 can be directed through window 20 to the substrate 36 being processed inside chamber 12. Window 20 can comprise any suitable material for transmitting ultraviolet radiation other than quartz, such as for example fused silica. Chamber 12 further has a window 24 comprised of quartz for permitting optical sensor 26 to monitor chemiluminescent emissions. Chamber 12 further has a window 28 comprised of calcium fluoride, zinc selenide, or other material transparent to infrared radiation for permitting infrared detector 30 to monitor the substrate temperature.

Reaction chamber 12 has an inlet port 32 for receiving a gas plasma effluent 33 from a plasma generator indicated generally at 34. Chamber 12 further has means, such as for example a "pillbox" gas plenum 35, for directing the plasma effluent over the substrate 36 through a plurality of apertures 37. This plenum 35 or other means is transparent to UV radiation, but it can control the gas plasma effluent and the distribution of the reactive species over the substrate surfaces. Plasma generator 34 will be described more fully in detail below.

Chamber 12 contains the substrate to be processed, indicated as 36 in FIG. 1. Substrate 36 can be for example any semiconductor such as silicon, germanium, or gallium arsenide, or a semiconductor with an oxide layer grown thereon, such as silicon dioxide. The apparatus shown in FIG. 1 is also suitable with slight modifications evident to those of skill in the art for processing other substrates, such as chrome or metal masks.

As seen in more detail in FIG. 2, wafer 36 is depicted as having a patterned layer of developed photoresist 38 deposited thereon, the pattern leaving certain portions 40 of the wafer 36 exposed and certain other portions 42 covered. FIG. 2 also shows wafer 36 having etches 40 formed therein. Etches 40 have floors 64 and sidewalls 62, although it is understood that these floors or sidewalls are not necessarily planar as shown in FIG. 2.

In the preferred embodiment of FIG. 1, the substrate or silicon wafer 36 comprises a first surface 39 and a second surface 41. The wafer 36 is supported by a set of three eleongated pointed quartz pin members 44, so as to have minimal contact area with wafer 36, such that the first surface 39 is positioned for irradiation from UV source 22. This set of pins 44 is preferred in that such a support means enables the substrate to be heated uniformly from below; however, any suitable means for holding the substrate 36 can be used as well.

An infrared source 46 is positioned underneath the substrate 36 inside the chamber 12. This infrared source 46 provides infrared radiation in the wavelength of about 1 to about 10 microns for heating the wafer by irradiating the second surface 41. In the case of a silicon substrate, the silicon is substantially transparent to infrared radiation, and a film, such as a layer of photoresist 38, can be heated from below by the infrared source 46 without substantially heating the silicon substrate. In this way, the film of photoresist 38 can be heated substantially independently of irradiation with UV.

In this apparatus the wafers reside on three pins, which are thermally isolated. When a wafer is placed into the process chamber, it is at room temperature. With this thermal isolation, the heat lamps can be ignited and the wafer heated to 300 degrees C. in 5 seconds, for example. The heat lamps can then be turned off, and the thernal isolation coupled with the vacuum permits the stripping rates mentioned hereinafter, without the need of having a massive wafer substrate-holder constantly maintained at high temperature.

This advantage allows the single wafer processing system to show a high throughput of wafers per hour, with simple cooling requirements.

A gas plasma 43, which provides at least one reactive specie for etching the substrate or stripping the photoresist from the substrate, is produced by the plasma generator 34. A gas or mixture of gases suitable for the particular substrate 36 being processed or the photoresist being removed is introduced at 48 and flows through a conduit 50 to the plasma chamber 52. Examples of such gases include freon 14 or oxygen. The gas inputs and mass flow control devices are well known in the art and are not shown.

A microwave exciter 54 energizes the gas in the plasma chamber 52 into the plasma 43. The microwave exciter 54 is driven by a microwave generator comprising a magnetron whose frequency is about 2450 Megahertz and whose output is typically less than about 500 watts. The microwaves are directed to the chamber 52, where a plasma or glow discharge region is created. It is understood that the scope of the present invention is not limited to a microwave plasma generator herein described, but could equally well be any means for generating a gas plasma, such as for example a radio frequency generator.

The gas plasma 43 created by the microwave energy typically comprises ions, free electrons, atoms, molecules, free radicals, and and other excited species, such as electronically excited species. The free radicals bear no net electric charge, but the constituent gases entering at 48 can be chosen so that the resultant free radicals comprise at least one reactive specie which is reactive with the substrate material being removed, such as the substrate being etched or the photoresist being removed from the substrate. For example, if the constituent gas is oxygen ($O_2$), then the resultant plasma will comprise at least the free radical or reactive specie O (atomic oxygen), which is reactive with materials such as organic photoresists. The constituent gas mixtures can be controlled by well known mass-flow control devices for precision. It may also be desirable to inject other gases downstream of the plasma generator.

This plasma 43 in the glow discharge region of the plasma chamber 34 also comprises ions and free electrons, which would bombard and possibly damage the substrate 36 if the substrate 36 were adjacent to or immersed in the glow discharge region. However, the plasma generator 34 is located in a region relatively remote from reaction chamber 12, which is located downstream from plasma generator 34. Reaction chamber 12 is connected to the plasma chamber 34 by conduit 58, which is of a predetermined length sufficient to permit a substantial portion of the ions and free electrons in the plasma in chamber 34 to recombine or dissipate before the plasma 43 flows downstream through conduit 58 to chamber 12.

Accordingly, the plasma effluent 33 that enters the reaction chamber has substantially no ions or electrons present. The surface of the substrate is thereby subjected to dry processing by being exposed to a gas comprising at least one reactive specie for reacting with the surface, without the presence of electrically charged particles. A particularly preferred reactive specie comprises at least one free radical, such as for example atomic oxygen.

In the apparatus 10 described herein, based on lifetimes of approximately microseconds for the ions and free electrons and approximately milliseconds to seconds for the free radicals or reactive species, the preferred length of conduit 58 is approximately 4 to 12 inches at a plasma flow rate of 1000 SCC/M. The rate of mass change in the chamber 12 is preferred to be approximately above 100 changes/minutes and most preferably about 800 changes/minute. The reactive species, which have significantly greater lifetimes as compared to the ions and free electrons, reach the reaction chamber 12 for reaction with substrate 36, which is thereby subjected to a plasma effluent 33 substantially free of electrically charged particles.

Ultraviolet source 22 is provided for irradiating the substrate 36 with ultraviolet radiation and thereby enhancing the reaction rate of the at least one reactive specie in the plasma effluent introduced into chamber 12. The preferred ultraviolet source for use in the present invention emits electromagnetic radiation in the range of about 1000 to about 3000 angstroms, although other type of UV radiation such as vacuum ultraviolet can be used.

Ultraviolet source 22 also collimates the UV radiation by means of a standard arrangement of mirrors and lens, so that the UV rays strike the floor 64 of the exposed substrate surface etches 40 at an angle substantially normal to the surface of the substrate and the floor 64 of the etch. As seen more clearly in FIG. 2, the UV rays indicated generally as arrows 60 can by proper aiming of the collimated UV radiation be made to strike the substrate 36 at approximately a 90° angle. The UV radiation is substantially not incident on the sidewalls 62 of the etch 40. Accordingly, the etch rate is enhanced on the floor 64 of the etch 40 and is substantially slower on the sidewall 62. In this way, the use of such normally-collimated UV radiation achieves anisotropic etching.

It can be seen that the apparatus disclosed above in FIG. 1 can be used in a process to produce a solid state device not only by producing substantially straight walled etches 40 in a substrate 36, butalso where there is a need for removing any predetermined portions of a layer of material from the surface of a substrate 36. For example, the removal of developed organic photoresist 38 from the surface of a substrate 36 such as a silicon wafer can be achieved just as can the removal of silicon by an etching procedure.

The fist step of the method is exposing the predetermined portions of the layer of material to be removed to a plasma effluent 33. The plasma 43 is produced in a region relatively remote from the substrate 36, so that the substrate is not subjected to the relatively strong electric fields and ion bombardment associated with the glow discharge region of a plasma. The portions to be removed can be predetermined by means of standard photolithographic methods.

The gas plasma effluent 33 is chosen to comprise at least one reactive specie; the electrically charged particles have in effect been substantially removed or eliminated from the plasma effluent so that the effluent is substantially free of ions or free electrons, whereby the damage to the substrate from ion bombardment is minimized. This substantial elimination of the electrically charged particles can be accomplished by transferring the plasma to the reaction chamber 12 over a distance sufficiently long to permit any electrically charged particles, such as ions or free electrons, to be dissipated by recombination.

Simultaneously with exposure to the plasma effluent 33, the portions of the substrate layer where the reaction rate such as the etching rate or the photoresist stripping rate is to be enhanced is irradiated with electromagnetic radiation comprising ultraviolet radiation 60. The substrate may also be irradiated with electromagnetic radiation comprising infrared radiation, preferably in the wavelength range of about 1 to about 10 microns, to heat the substrate. If anisotropic etching is to be achieved, the ultraviolet radiation should be normally collimated so that the proper directionality can be imparted to the reactive specie.

More particularly with respect to the stripping operation, the throughput rate or the rate at which wafers can be stripped is an important parameter. However, if the stripping reaction rate is too high or if a highly reactive etchant gas is used with a heated substrate, the underlying films may be etched as well along with the stripping of the photoresist. However, when UV excitation is used, the reaction rates with the use of plain oxygen or other non-etching gas mixtures are enhanced to a point where practical stripping rates can be achieved. Freon 14, which when combined with oxygen produces a distinctive etching effect, need not be used. Therefore, the method of the present invention reduces the concern for both dielectric breakdown and destructive etching.

Although the method and apparatus of the present invention is described in terms of a dry process using the effluent from a gas plasma, it is understood that the present invention contemplates any dry process employing a chemically reactive specie, such as for example a free radical, in conjunction with UV radiation to selectively enhance reaction rates on predetermined portions of a substrate. The use of an effluent from a gas plasma having substantially no charged particles present is preferred as being a particularly efficient way of practicing the present invention.

The method of the present invention is particularly suited to the processing of one wafer at a time, known as single wafer processing. There are two particularly preferred types of processes for which this method applies by way of example only; first, the stripping of photoresist from a wafer which has exposed other surfaces, such as silicon nitride, silicon oxide, or polysilicon, wherein it is desired to remove the photoresist at a relatively high rate with negligible etching of the other exposed substrate material; second, maximization of the rate of etching of the exposed substrate and minimization of the rate of removal of the photoresist.

The apparatus described above with respect to FIG. 1 is well suited to the accomplishment of these objectives through appropriate utilization of gas mixtures to generate the optimal free radical species mixture, optimization of the temperature by independent control through infrared heating with lamps as described hereinbefore, and maintenance of the optimal pressure through control of the total mass flow rates of gases employed and throttling of the exhaust pumping system shown at 15 and 16.

Figure 4:
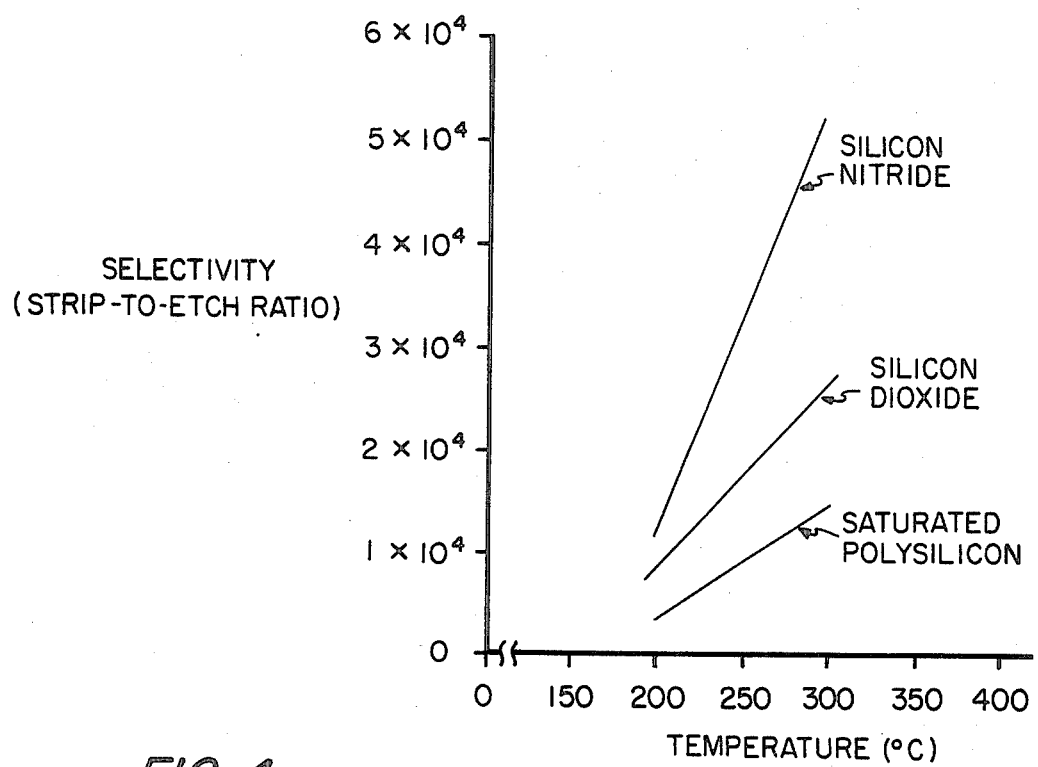
FIG. 4 is a plot of selectivity versus temperature for a preferred embodiment of the present invention.

In the method of photoresist stripping of the present invention, the objective is to rapidly remove the photoresist material with minimal etching of the underlying subtrates. This objective can be met with the excellent results shown in plot of FIG. 3, which shows the rate of stripping of photoresist as a function of the temperature of the substrate. The plot of FIG. 4 shows the selectivity; i.e., the rate of removing photoresist compared to the rate of etching the substrate over the same temperature ranges.

It is seen that at temperatures in the range of 250 to 300 degrees C., high selectivities are achievable while at the same time rapid stripping rates are manifested. Since fluorine containing gas is employed in this process, and the danger of etching these substrates is of major concern when fluorine-containing gases are present, the achievement of these high selectivities produces an effective process and eliminates any need for concern over possible substrate etching during these stripping processes.

These conditions are preferably achieved utilizing a gas mixture input at 48 in FIG. 1 comprising 1020 sccm of oxygen gas, 70 sccm of $CF^4$ gas, and 30 sccm of a premix gas of 97% nitrogen by volume and 3% hydrogen by volume. The preferred chamber pressure is 0.45 torr with a preferred dissipation of 400 watts of microwave power in the discharge region to generate the free radicals. In addition, this result is achieved with no radiation damage of any kind to the wafers, and no effect on their electrical properties of devices, such as threshold voltage shifts or dielectric breakdown.

Figure 5:
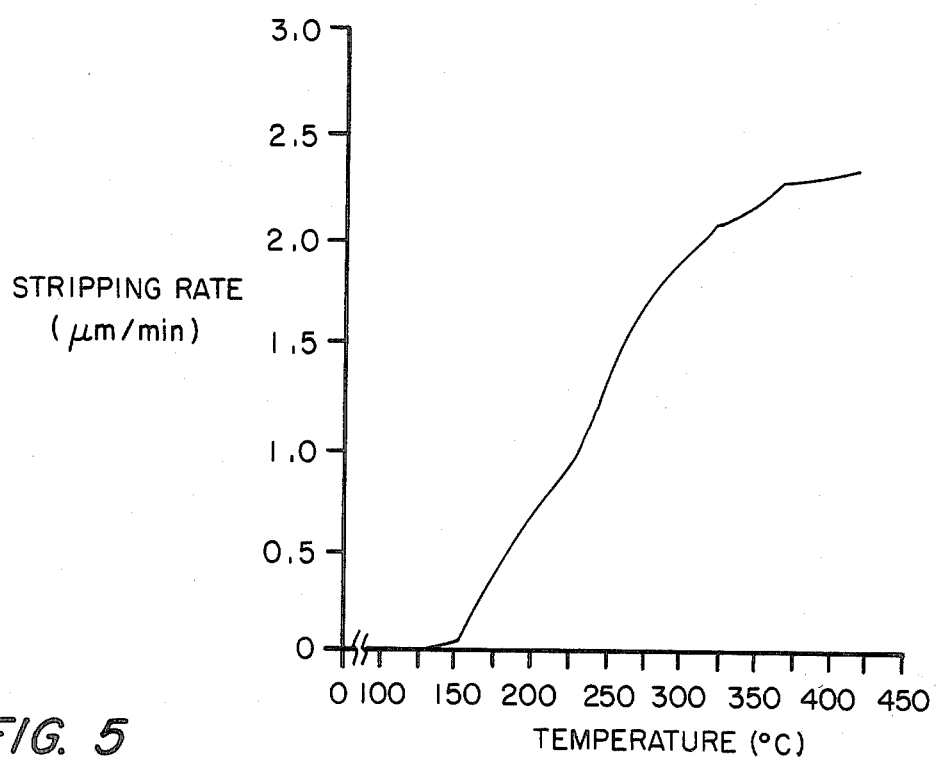
FIG. 5 is a plot of stripping rate versus temperature for a preferred embodiment of the present invention.

Another preferred set of stripping conditions, which employs no halogen gas at all, produces a very high chemical selectivity because etching of the substrate is minimal if freon is not present. These stripping rates are shown in FIG. 5, where it is shown that above 275 degrees C. stripping rates of 2 microns per minute are achieved without halogen present. The preferred gas mixture of this example comprises 1020 sccm of oxygen with 30 sccm of the premix of 97% nitrogen and 3% hydrogen, under the same conditions of microwave power and pressure indicated above with respect to FIGS. 3 and 4.

In accordance with the present invention it is further demonstrated that, through appropriate temperature control and gas mixture, the performance of these processes can be altered to produce high etching rates and low photoresist stripping rates. In FIG. 4, at 200 degrees C. where the selectivity of stripping to oxide etching is seen to be approximately 7,000:1, the rates of stripping as seen from FIG. 3 is 20,000 angstroms per minute (2 microns/minute), while the etching rate is only about 3 angstroms/minute.

Figure 6:
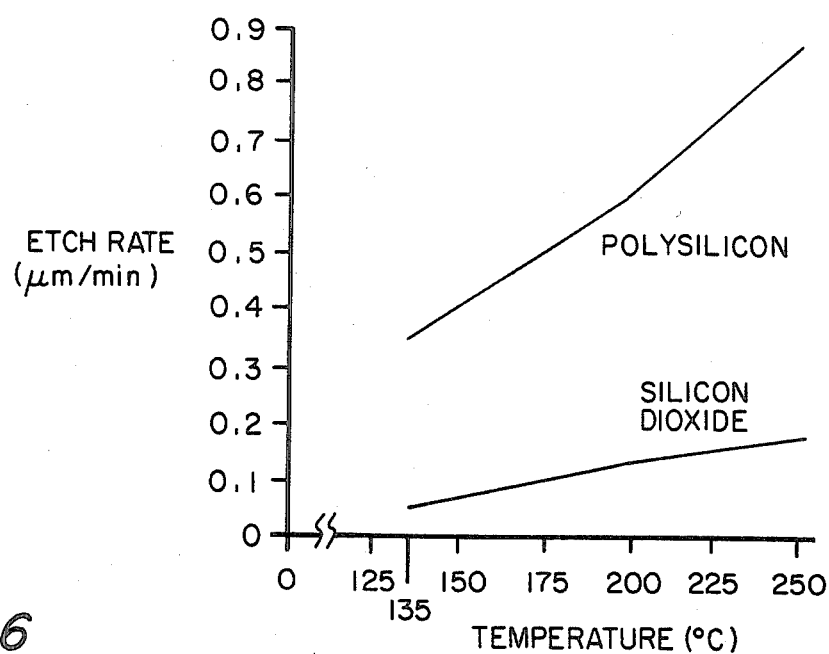
FIG. 6 is a plot of etch rate versus temperature for a preferred embodiment of the present invention.

By employing a gas mixture which comprises 420 sccm $CF^4$ and 20 sccm oxygen, an etching rate of 1200 angstroms/minute, as shown in FIG. 6, is achieved for oxide. With this mixture the rate of photoresist stripping is less than 100 angstroms/minute, at the same 200 degrees C. and microwave power and pressure.

It should be understood that various changes and modifications of the preferred methods and embodiments described above will be apparent to those of skill in the art. Such changes and modifications can be made without departing from the spirit and scope of the present invention, and it is therefore intended that such changes and modifications be covered by the following claims.

I claim:

1. A method for removing photoresist from the surface of a substrate, the method comprising:
    (a) producing a gas plasma from a gas mixture comprising oxygen, $CF^4$, nitrogen, and hydrogen in a region relatively remote from said substrate;
    (b) substantially eliminating any electrically charged particles from said plasma to produce a plasma effluent;
    (c) heating said substrate to a temperature in the range of from about 250 to 300 degrees Centigrade;
    (d) exposing said substrate and the photoresist thereon to said plasma effluent while said temperature is maintained; and
    (e) simultaneously with the exposure step, irradiating the substrate with collimated ultraviolet radiation.

2. The method of claim 1, wherein said heating step comprises irradiating the substrate with infrared radiation while said substrate is supported in relative thermal isolation on a plurality of quartz supports.

3. A method for removing photoresist from the surface of a substrate, the method comprising:
    (a) producing a gas plasma from a gas mixture comprising oxygen, nitrogen, and hydrogen in a region relatively remote from said substrate;
    (b) substantially eliminating any electrically charged particles from said plasma to produce a plasma effluent;
    (c) heating said substrate to a temperature greater than about 275 degrees Centigrade;
    (d) exposing said substrate and the photoresist thereon to said plasma effluent while said temperature is maintained; and
    (e) simultaneously with the exposure step, irradiating the substrate with collimated ultraviolet radiation.

4. A method for etching a substrate, the method comprising:
    (a) producing a gas plasma from a gas comprising $CF^4$ and oxygen in a region relatively remote from said substrate;
    (b) substantially eliminating any electrically charged particles from said plasma to produce a plasma effluent;
    (c) heating said substrate to a temperature of approximately 200 degrees Centigrade;
    (d) exposing said substrate to said plasma effluent while said temperature is maintained; and
    (e) simultaneously with the exposure step, irradiating the substrate with collimated ultraviolet radiation.

* * * * *